(12) United States Patent
Karasawa

(10) Patent No.: US 6,200,071 B1
(45) Date of Patent: *Mar. 13, 2001

(54) TRANSFER APPARATUS AND TRANSFER METHOD FOR PARTICULATE MATERIAL

(75) Inventor: Yukihiko Karasawa, Ohmiya (JP)

(73) Assignees: Applied Science Karasawa Lab. & Co., Ltd., Saitama (JP); Ball Semiconductor Inc., Dallas, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/995,393

(22) Filed: Dec. 22, 1997

(30) Foreign Application Priority Data

Oct. 6, 1997 (JP) ................................. 9-272295

(51) Int. Cl.[7] ........................................... B65G 53/34
(52) U.S. Cl. ........................ 406/194; 406/193; 406/92
(58) Field of Search ........................ 406/193, 92, 194

(56) References Cited

U.S. PATENT DOCUMENTS

| | | | | |
|---|---|---|---|---|
| 998,762 | * | 7/1911 | Faller | 406/92 |
| 2,310,265 | * | 2/1943 | Sweeny | 406/194 |
| 2,661,194 | * | 12/1953 | Katovsich | 406/92 |
| 5,125,979 | * | 6/1992 | Swain et al. | 134/7 |
| 5,429,156 | * | 7/1995 | Ueda et al. | 406/92 |
| 5,846,275 | * | 12/1998 | Lane et al. | 55/431 |

FOREIGN PATENT DOCUMENTS

| | | | | |
|---|---|---|---|---|
| 301284 | * | 11/1992 | (DE) | 406/194 |
| 154522 | * | 6/1988 | (JP) | 406/92 |
| 262338 | * | 10/1988 | (JP) | 406/92 |

* cited by examiner

Primary Examiner—Christopher P. Ellis
Assistant Examiner—Joe Dillon, Jr.
(74) Attorney, Agent, or Firm—Gottlieb, Rackman & Reisman, P.C.; Jeffrey M. Kaden; Norbert P. Holler

(57) ABSTRACT

An apparatus and method for transferring a particulate material in a non-contact manner. The apparatus has a driving device including a nozzle curved surface portion fitted to the transfer pipe to join with the inner wall surface of the pipe. The nozzle curved surface portion has a curved surface whose diameter continuously increases from the inner wall surface. The driving device further includes an annular gap-forming member that forms a nozzle gap between it and the nozzle curved surface portion. A fluid is caused to flow into the transfer pipe from the driving device, thereby forming a buffer layer of a spiral flow in the vicinity of the inner wall surface of the transfer pipe and thus keeping the particulate material in a non-contact state. Moreover, a pressure gradient is produced between the inner wall surface of the transfer pipe and the central portion of the transfer pipe to make the pressure in the central portion negative relative to the pressure at the inner wall surface of the pipe, thereby transferring the particulate material while keeping it from contact with the wall surface of the transfer pipe. The apparatus is suitable for the production of spherical semiconductor devices.

5 Claims, 2 Drawing Sheets

TRANSFER APPARATUS AND TRANSFER METHOD FOR PARTICULATE MATERIAL

BACKGROUND OF THE INVENTION

The present invention relates to an apparatus and method for transferring a particulate material through a pipeline while keeping it from contact with the inner wall surface of the pipe. More particularly, the present invention relates to an apparatus and method for transferring pulverized semiconductor particles through a pipeline in a non-contact state to produce semiconductor devices.

There have been known apparatuses for transferring a particulate material through a pipeline while keeping it from contact with the inner wall surface of the pipe. The conventional transfer apparatuses employ a method wherein a powdery material is electrically charged by a multiplicity of electrodes disposed on the inner wall of the pipe, thereby allowing the powdery material to be transferred in the state of being out of contact with the wall surface of the pipeline. However, these conventional apparatuses are used to transfer a fine powdery material having a particle diameter in the range of from several micrometers to several tens of micrometers. There has been no apparatus designed to transfer a particulate material having a particle diameter of 1 millimeter or so through a pipeline while keeping it from contact with the inner wall of the pipe.

The transfer method wherein particles are electrically charged is likely to cause dielectric breakdown or other failure in the case of transferring electronic material particles, particularly finely pulverized semiconductor particles. Therefore, the method wherein particles are electrically charged by an electric field could not be adopted as a non-contact transfer method for semiconductor particles.

There has been another known non-contact transfer method that utilizes magnetic attraction and repulsion forces. In this case, however, it is essential that the object to be transferred should be a magnetic material or a substance having magnetism, or a transfer carrier made of a magnetic material should be used. Thus, the non-contact transfer method cannot be used for the purpose of transferring particles of a non-magnetic material individually.

A method of transferring an object in a non-contact state by a gas flow is carried out in a process of producing paper or other belt-shaped members. However, a gas flow is not used for non-contact transfer of particles. There has been proposed no method of efficiently transferring particles in a non-contact state.

An object of the present invention is to provide an apparatus for transferring a particulate material through a pipeline while keeping it from contact with the inner wall of the pipe. More particularly, an object of the present invention is to provide a device whereby a semiconductor material previously formed into spherical particles is transferred in the state of being out of contact with the inner wall of the pipe.

More particularly, an object of the present invention is to provide a transfer apparatus and method suitable for the production of a spherical semiconductor integrated circuit in which a semiconductor circuit is formed on the surface of a spherical semiconductor particle, which is proposed, for example, in U.S. patent application Ser. Nos. 60/0320340, 08/858004, and PCT/US97-14922 by the assignees of the present invention.

Existing integrated circuits are fabricated by forming circuits on a disk-shaped silicon wafer, and there is a tendency to use silicon wafers of larger sizes, i.e. to change over from wafers of 8 inches in diameter to wafers having a diameter of 12 inches, in order to produce a large number of semiconductor devices in a short period of time. However, as the diameter of silicon wafers increases, the size of production systems increases, resulting in a need for large-sized production facilities, e.g. clean rooms for accommodating production equipment.

In the spherical semiconductor integrated circuit proposed by the assignees of the present invention, a semiconductor circuit is formed on the surface of a spherical silicon particle without using a silicon wafer. The spherical semiconductor integrated circuit is a novel device that makes effective use of the surface area of a sphere, and it is an epoch-making invention that needs no large-scale clean room because no large-sized production system is needed. Under these circumstances, it is demanded to develop a novel method for producing the spherical semiconductor integrated circuit.

SUMMARY OF THE INVENTION

Figure 1:
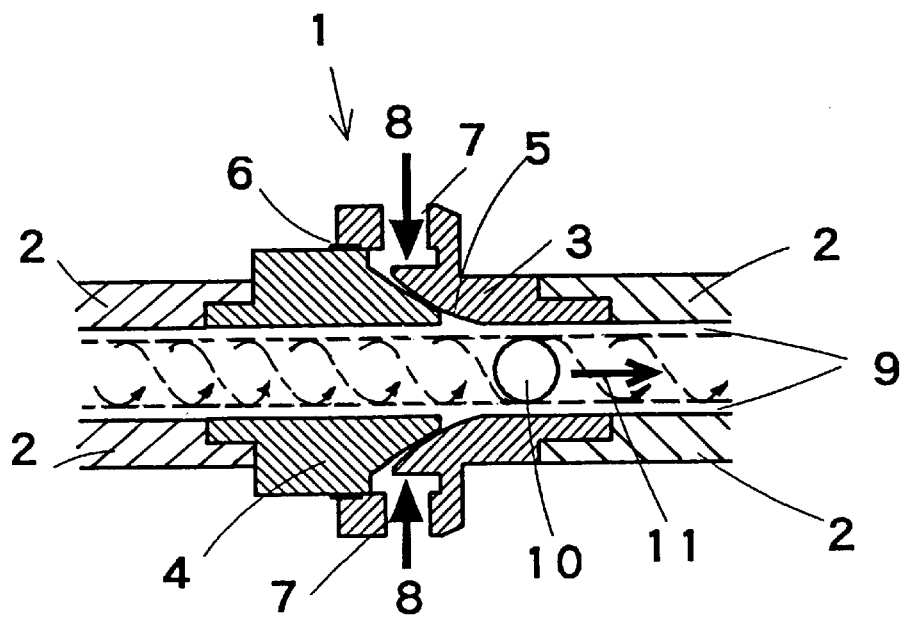
FIG. 1 is a diagram illustrating a driving device for generating driving force in the transfer apparatus according to the present invention.

The present invention provides a transfer apparatus of the type wherein a particulate material is transferred through a transfer pipe while being kept from contact with the inner wall surface of the transfer pipe. The transfer apparatus has a driving device including a nozzle curved surface portion fitted to the transfer pipe to join with the inner wall surface of the transfer pipe. The nozzle curved surface portion has a curved surface whose diameter continuously increases from the inner wall surface. The driving device further includes an annular gap-forming member that forms a nozzle gap between the annular gap-forming member and the nozzle curved surface portion. A driving fluid is caused to flow into the transfer pipe from the driving device and spirally through the transfer pipe, thereby forming a buffer layer of the spirally flowing driving fluid in the vicinity of the inner wall surface of the transfer pipe and thus keeping the particulate material from contact with the inner wall surface of the transfer pipe, and transferring the particulate material by a pressure gradient produced between the inner wall surface of the transfer pipe and the central portion of the transfer pipe.

In the transfer apparatus, the transfer pipe may be additionally provided with a processing nozzle located downstream of the driving device, which nozzle supplies a fluid for processing the particulate material, thereby enabling the processing of the particulate material while it is being transferred along the pipe. Optionally, a second driving device may be connected with the transfer pipe downstream of the processing fluid supply nozzle.

In the transfer apparatus, the particulate material may be a semiconductor particle for producing a spherical semiconductor device.

In addition, the present invention provides a transfer method of transferring a particulate material through a transfer pipe while keeping it from contact with the inner wall surface of the transfer pipe. The method comprises preparing a nozzle curved surface portion fitted to the transfer pipe to join with the inner wall surface of the transfer pipe and having a curved surface whose diameter continuously increases from the inner wall surface, and an annular gap-forming member that forms a nozzle gap between the annular gap-forming member and the nozzle curved surface portion; and causing a fluid to flow into the transfer pipe from the nozzle gap, thereby forming a buffer layer of a spiral flow in the vicinity of the inner wall surface of the transfer pipe by Coanda effect of the nozzle curved surface portion and thus keeping the particulate material from contact with the inner wall surface of the transfer pipe, and transferring the particulate material by a pressure gradient produced between the inner wall surface of the transfer pipe and the central portion of the transfer pipe.

In the transfer method, a fluid for processing the particulate material may be supplied during transfer to carry out a processing operation for the particulate material.

In the transfer method, the particulate material may be a semiconductor particle for producing a spherical semiconductor device.

DESCRIPTION OF THE PREFERRED EMBODIMENT

The present invention realizes non-contact transfer of a particulate material through a pipeline by utilizing Coanda effect.

The present invention will be described below with reference to the accompanying drawings.

FIG. 1 is a diagram illustrating a driving device that generates driving force in the transfer apparatus according to the present invention.

A driving device 1 is fitted to a transfer pipe 2 which is circular in a section taken in a direction perpendicular to the axis. The driving device 1 includes a nozzle curved surface portion 3 having a curved surface whose diameter continuously decreases to a value equal to the inner diameter of the transfer pipe 2. The driving device 1 further includes an annular gap-forming member 4 that faces the nozzle curved surface portion 3 to form a nozzle gap. An annular nozzle gap 5 formed between the nozzle curved surface portion 3 and the annular gap-forming member 4 is adjusted by a securing and adjusting portion 6 such that an effective flow of fluid is produced at the nozzle curved surface. The securing and adjusting portion 6 enables the nozzle curved surface portion 3 and the annular gap-forming member 4 to be secured after the adjustment of the annular nozzle gap 5 by any desired method, e.g. by screwing a securing nut onto a mounting screw, or by providing screws for securing the nozzle curved surface portion 3 and the annular gap-forming member 4 to each other, or by injecting a substance for securing an adjusting screw.

It should be noted that the nozzle gap formed between the nozzle curved surface portion 3 and the annular gap-forming member 4 may be predetermined to a given size, and the nozzle curved surface portion 3 and the annular gap-forming member 4 may be formed from an integral member.

When the driving device 1 is supplied with a driving fluid 8 from a driving fluid inlet 7 such that a predetermined flow rate is attained, the fluid 8 passing through the annular nozzle gap 5 flows spirally in the the transfer pipe 2 and, by Coanda effect, flows along the surface of the nozzle curved surface portion 3, thereby forming a buffer layer 9 of the spirally flowing fluid in the transfer pipe 2 around the nozzle curved surface portion 3. As a result, a fast swirling flow occurs in the axial direction of the transfer pipe 2. Consequently, a remarkable differential pressure is produced between the pressure at the inner wall of the transfer pipe 2 and the pressure in the central portion of the transfer pipe 2. That is, the pressure in the central portion of the transfer pipe 2 becomes negative relative to the pressure at the inner wall of the transfer pipe 2. Accordingly, a particulate material 10 is transferred in a transfer direction 11 in the state of being out of contact with the wall surface of the transfer pipe 2.

As the fluid 8 for driving, either a gas or a liquid may be used. It is possible to select an appropriate fluid according to the type of particulate material to be transferred and the purpose of processing carried out for each particular particulate material.

In the present invention, the method of supplying the driving fluid 8 from the driving fluid inlet 7 implies not only a method wherein the fluid 8 is caused to flow into the transfer pipe 2 by pressurization, but also a method wherein the fluid 8 is caused to flow into the transfer pipe 2 from the driving fluid inlet 7 by suction from the outlet side of the transfer pipe 2.

Figure 2:
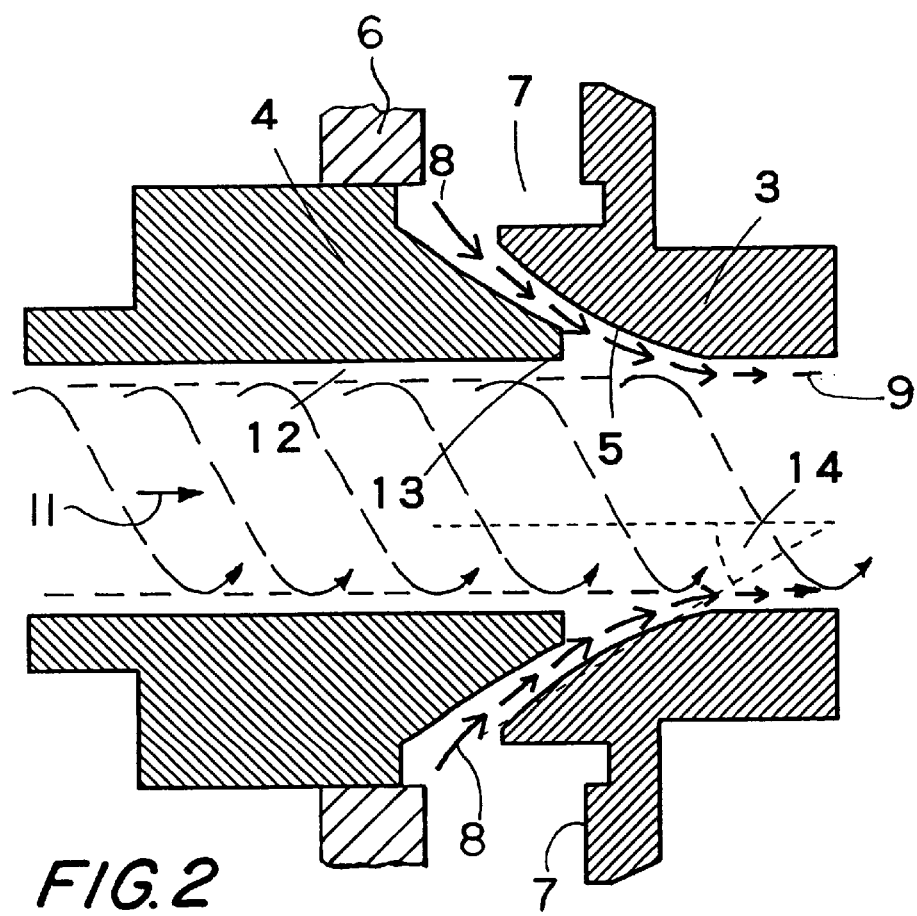
FIG. 2 is a diagram illustrating a nozzle portion of the driving device, which is formed from a nozzle curved surface portion and an annular gap-forming member.

FIG. 2 is a diagram illustrating a nozzle portion of the driving device 1 that is formed from the nozzle curved surface portion 3 and the annular gap-forming member 4.

The driving fluid 8 supplied from the driving fluid inlet 7 flows into the transfer pipe 2 through the annular nozzle gap 5 formed between the nozzle curved surface portion 3 and the annular gap-forming member 4. At this time, because the annular nozzle gap 5 is formed in an annular shape, the fluid 8 flows along the curved surface of the nozzle curved surface portion 3 by Coanda effect, as shown by the arrows in the figure, and forms a spiral flow. The spirally flowing driving fluid forms a buffer layer 9 in the vicinity of the pipe wall, and a negative pressure is produced in the transfer pipe 2 by a fast flow in the axial direction of the transfer pipe 2. It is preferable that the inner wall surface 12 of the annular gap-forming member 4 should have the same inner diameter as that of the inner wall surface of the transfer pipe 2. The distal end portion 13 of the annular gap-forming member 4 needs to form a gap between the end portion 13 and the nozzle curved surface portion 3 that is sufficiently larger than the nozzle portion so that the fluid 8 satisfactorily flows along the wall surface of the nozzle curved surface portion 3 by Coanda effect. It is preferable for the distal end portion 13 to have a surface perpendicular to the axis of the transfer pipe 2.

The angle 14 formed between the nozzle curved surface portion 3 and the center axis of the transfer pipe 2 is preferably in the range of from 10 degrees to 20 degrees.

Figure 3:
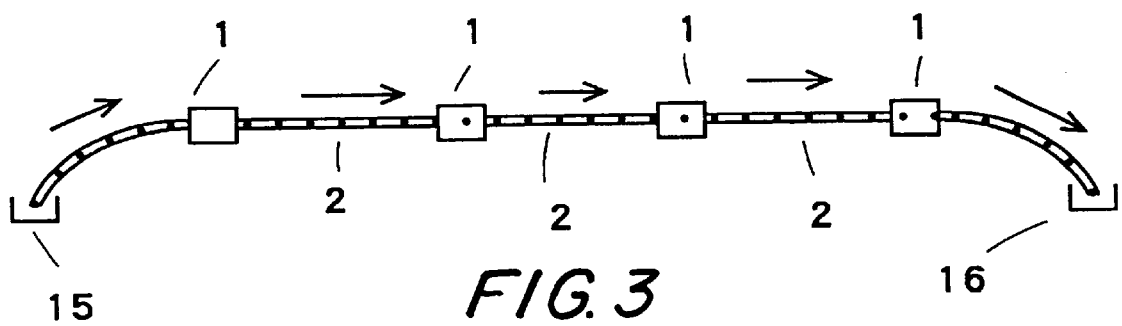
FIG. 3 is a diagram illustrating an arrangement of the transfer apparatus in a case where a particulate material is transferred through a long pipeline.

FIG. 3 is a diagram illustrating an arrangement of the transfer apparatus in a case where a particulate material is transferred through a long pipeline.

Driving devices 1 are disposed at predetermined intervals and fitted to a series of sections of a transfer pipe 2. A particulate material is sucked into the transfer pipe 2 from a particulate material supply part 15 by a negative pressure in the transfer pipe 2 that is produced by a spiral flow formed by the driving nozzles, and the sucked particulate material is transferred in a non-contact state and collected in a particulate material collecting part 16.

Next, the present invention will be described with regard to a case where the transfer apparatus according to the present invention is a processing apparatus that carries out processing for a particulate material in the process of transferring it.

Figure 4:
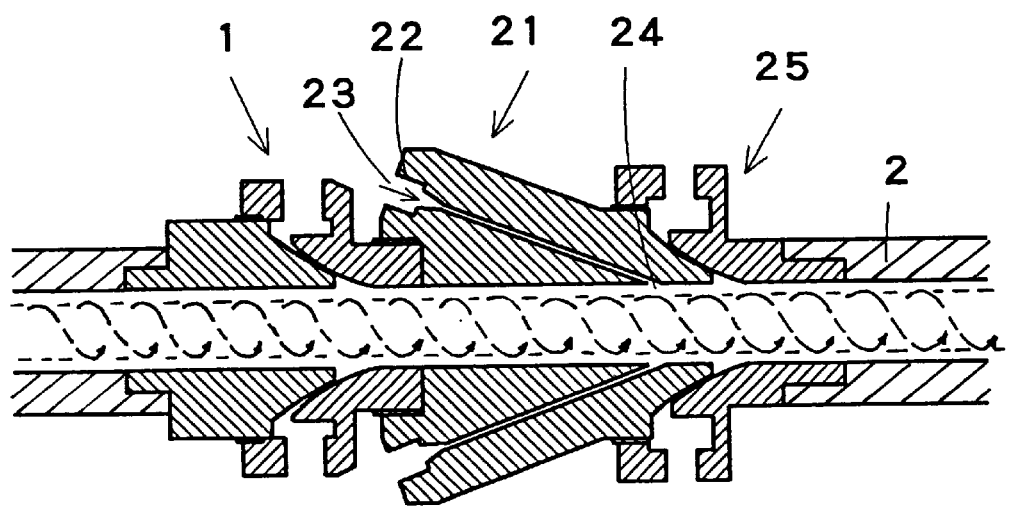
FIG. 4 is a diagram illustrating a transfer apparatus provided with a processing device, together with a driving device.

FIG. 4 is a diagram illustrating a transfer apparatus provided with a processing device, together with a driving device.

The apparatus shown in FIG. 4 has a processing fluid supply device 21, together with the driving device 1 as described in connection with FIG. 1. The processing fluid supply device 21 has at least one processing fluid supply nozzle 24 that supplies a processing fluid 23 into the transfer pipe 2 from a processing fluid supply port 22. It is preferable to provide a plurality of processing fluid supply nozzles 24 so that the processing fluid 23 is supplied uniformly onto the surface of a particulate material. If processing fluid supply nozzles 24 having the same diameter are provided at equal intervals, no effect is given to the movement of a particulate material; therefore, the processing fluid 23 will not act uniformly on the surface of the particulate material. Accordingly, it is preferable to enable the processing fluid 23 to act uniformly on the surface of the particulate material by giving spinning force to the particulate material, for example, by disposing a plurality of processing fluid supply nozzles 24 having different diameters, or by disposing a plurality of processing fluid supply nozzles 24 at irregular intervals, or by varying the flow rate of the processing fluid 23 supplied into each nozzle.

In addition to the processing fluid supply device 21, a second driving device 25 is provided downstream of the processing fluid supply device 21 and may be supplied with, as a fluid for driving, a substance that enhances the action of the processing fluid 23. If a gas, e.g. air, nitrogen or argon, is used as a fluid for driving, the downstream driving device 25 is preferably supplied with a gas of higher temperature than that of the gas supplied to the driving device 1. By doing so, the action of the processing fluid 23 supplied from the processing fluid supply device 21 can be enhanced; in a case where a particulate material-coating liquid is supplied as a processing fluid to form a coating film on the surface of a particulate material, the drying rate of the coating liquid can be increased.

Next, the transfer apparatus according to the present invention will be described with regard to a case where a semiconductor integrated circuit is produced by using a spherical semiconductor material.

When a silicon sphere having a diameter of 1 millimeter is used as a spherical semiconductor material, for example, it is preferable to use a pipe having an inner diameter of 1.4 millimeters as a transfer pipe for transferring and processing the spherical semiconductor material in a non-contact manner. The gap between the nozzle curved surface portion formed on the driving device and the annular gap-forming member disposed to face the nozzle curved surface portion may be in the range of from 0.02 millimeter to 0.5 millimeter, preferably from 0.04 millimeter to 0.5 millimeter.

It is preferable to supply a fluid for driving from a plurality of supply ports so that the driving fluid is supplied uniformly from the gap between the annular gap-forming member and the nozzle curved surface portion. For example, in a case where a gas is supplied from two supply ports at a flow rate of 1.65 Nl/min. under a supply pressure of 4 kgf/cm$^2$, a central portion of the transfer pipe that has a diameter of 1.2 millimeters becomes a transfer region placed under a negative pressure of the order of 0.33 kgf/cm$^2$. In addition, a spiral flow having a thickness of the order of 0.1 millimeter occurs along the wall surface of the transfer pipe, and thus a buffer layer of from 1 to 1.5 kgf/cm$^2$ can be formed in the vicinity of the wall surface. Therefore, the spherical semiconductor material can be transferred at high speed in a non-contact state.

Under these conditions, spherical semiconductor particles having a diameter of 1 millimeter can be transferred in a non-contact manner at a rate of about 5,000 particles per second when the interval between each pair of adjacent particles is kept at 1 millimeter.

Coating of a photoresist, which is indispensable for photolithography of semiconductor materials, may be carried out during transfer as described below.

In a case where a photoresist is supplied from processing fluid supply nozzles by the apparatus shown in FIG. 4, processing fluid supply nozzles having different diameters, e.g. 0.1 millimeter, 0.15 millimeter and 0.2 millimeter, are used, and spinning force is given to a spherical semiconductor material by a differential pressure produced when the photoresist is jetted out from the nozzles, thereby enabling the photoresist to be uniformly coated on the surface of the spherical semiconductor material.

By supplying a high-temperature fluid from the downstream driving device, which is disposed downstream the processing fluid supply nozzles, it is possible to coat the photoresist uniformly on the surface of the spherical semiconductor material while transferring the semiconductor material in a non-contact manner.

Regarding a constituent material used for the apparatus according to the present invention, it is possible to use any material that is not affected by a processing fluid or other fluid used in the apparatus. In a case where semiconductor devices are produced by using a particulate semiconductor material, it is preferable to use a fluorocarbon resin material or a metallic material having its inner surface coated with a fluorocarbon resin to thereby prevent contamination with metallic ions.

The method and apparatus according to the present invention enable a particulate material to be transferred through a transfer pipe in a non-contact manner and at high speed without giving an adverse effect on the surface of the particulate material, and thus can be applied to a process that requires non-contact transfer and processing as in the production of semiconductor devices using a spherical semiconductor material.

What I claim is:

1. An apparatus for transferring a particulate material, in the form of a quantity of spherical semiconductor particles each having a surface on which a respective spherical semiconductor integrated circuit device including a circuit is to be formed, by means of a flow of a driving fluid through a transfer pipe having in its interior an inner wall surface and an axial mid-region, said apparatus comprising:

(a) a first driving means for effecting a spiral flow of said driving fluid through said transfer pipe in the axial direction of the latter, and for thereby effecting an axial flow of said sperical semiconductor particles through said transfer pipe;

(b) said first driving means including a nozzle curved surface portion fitted at a downstream region thereof to said transfer pipe to join with said inner wall surface of said transfer pipe, said nozzle curved surface portion having a curved surface whose diameter continuously increases in an upstream direction from its juncture with said inner wall surface of said transfer pipe;

(c) an annular gap-forming member arranged relative to said nozzle curved surface portion so as to form a nozzle gap between said annular gap-forming member and said nozzle curved surface portion, said nozzle gap being in communication with both a source of said driving fluid and said interior of said transfer pipe; and (d) said nozzle gap enabling said driving fluid flowing through said nozzle gap to enter said transfer pipe in a manner resulting in said spiral flow of said driving fluid and to form, by Coanda effect, a buffer layer of said driving fluid adjacent said inner wall surface of said transfer pipe, and said buffer layer, by virtue of a pressure gradient produced in said driving fluid within said transfer pipe between said inner wall surface and said axial mid-region of said transfer pipe, maintaining said spherical semiconductor particles in movement along said axial mid-region of said transfer pipe and out of contact with said inner wall surface of said transfer pipe.

2. An apparatus according to claim 1, and further comprising (a) a source of a processing fluid for processing said spherical semiconductor particles to form said integrated circuit devices thereon, and (b) a processing fluid supply nozzle having an intake end and a discharge end, said processing fluid supply nozzle being in communication at said intake end with said source of processing fluid and being in communication at said discharge end with said interior of said transfer pipe downstream of said first driving means, thereby enabling processing of said spherical semiconductor particles while the same are being transferred through said transfer pipe by said driving fluid.

3. An apparatus according to claim 2, and further including a second driving means substantially identical to said first driving means, said second driving means being connected with said transfer pipe downstream of the location of said processing fluid supply nozzle.

4. An apparatus according to claim 2, wherein said processing fluid by which said circuits are formed on said surfaces of said spherical semiconductor particles is a photoresist.

5. An apparatus according to claim 4, and further including a second driving means substantially identical to said first driving means, said second driving means being connected with said transfer pipe downstream of the location of said processing fluid supply nozzle.

* * * * *